United States Patent
Corbin et al.

(10) Patent No.: US 6,337,540 B1
(45) Date of Patent: Jan. 8, 2002

(54) HIGH BRIGHTNESS POINT ION SOURCES USING LIQUID IONIC COMPOUNDS

(75) Inventors: Antoine Corbin, Paris; Pierre Sudraud, Saint Cyr Sour Dourdan; Rainer Sailer, Les Ulis, all of (FR)

(73) Assignee: International Business Machines Corporation, Armonk, NY (US)

( * ) Notice: Subject to any disclaimer, the term of this patent is extended or adjusted under 35 U.S.C. 154(b) by 1011 days.

(21) Appl. No.: 08/541,663

(22) Filed: Oct. 10, 1995

(30) Foreign Application Priority Data

Oct. 7, 1994 (EP) .............................................. 94480098

(51) Int. Cl.[7] .............................. H01J 7/24; H05B 31/26
(52) U.S. Cl. ............................ 315/111.21; 315/111.81; 250/492.21; 219/121.48; 204/298.41
(58) Field of Search ..................... 315/111.21, 111.81; 250/492.21; 219/121.48, 121.52, 121.53, 121.56; 204/298.41, 298.04, 298.05

(56) References Cited

U.S. PATENT DOCUMENTS 5,504,340 A * 4/1996 Mizumura et al. ...... 250/492.21

FOREIGN PATENT DOCUMENTS

| EP | 0080170 | 11/1982 | ............ H01J/27/26 |
| EP | 0091777 | 4/1983 | ............ H01J/27/22 |
| JP | 59054156 | 3/1984 | |

OTHER PUBLICATIONS

Lithium Ino Emission From a Liquid Metal Ino Source if LiNI3, A.E. Bell, G.A. Schwind, S. Rao and L.W. Swanson. Aug. 11, 1988, International Journal of Mass Spectrometry and Ion Processes, pp. 59–68.

Electrohydrodynamic Emission of Positive and Negative Ions From Alkali–Metal Halide Melts, N.V. Alyakrinskaya, V.V. Kavitskii, V.B. Kaznacheev and A.B. Mokrov, 2348 Soviet Physics:Technical Physics, Jun. 1992, No. 6, pp. 671–674.

* cited by examiner

Primary Examiner—Michael B. Shingleton
(74) Attorney, Agent, or Firm—Ira D. Blecker (57) ABSTRACT

A novel high brightness point ion source (10) that is adapted to operate with liquid ionic compounds such as mixtures of molten salts, bases or acids. The ion source is basically comprised of two parts: the needle assembly (11) and the extraction assembly (12). The former consists of a point shaped needle (13) made of a refractory ceramic material, whose sharpened extremity is referred to as the tip (13a). The needle is partially lodged in a recess of an insulating support (15). A heating coil (14) made of stainless steel is tightly wound around a portion of the needle adjacent to the tip. The needle is coated with the mixture, for instance, by dipping in a crucible containing the mixture. The extraction assembly is comprised of a metal extracting electrode (20) provided with a central aperture that is screwed on a cylindrical metallic body (19), so that the spacing between the tip and the aperture center is adjustable. The needle assembly is mounted inside the cylindrical body and accurately affixed thereto by centering screws (22). The high brightness point ion source is then ready for use in a FIB column. A heating current supply (18) is connected to the coil extremities to melt the mixture if necessary. An extraction voltage supply (23) applies a potential difference between the extraction assembly and the mixture at the tip apex for ion emission.

16 Claims, 3 Drawing Sheets

HIGH BRIGHTNESS POINT ION SOURCES USING LIQUID IONIC COMPOUNDS

FIELD OF INVENTION

The present invention relates to focused ion beam (FIB) technology and more particularly to novel high brightness point ion sources using ionic compounds in the liquid state, including mixtures of molten salts, acids or bases. The novel high brightness point ion sources associate the desirable high brightness, ion intensities and energy distribution characteristics of conventional liquid metal ion sources (LMIS) with the possibility of significantly enlarging their spectrum of ion species. In particular, chemically reactive ions are now produced including positive and negative ions, molecular ions and even protons, which has not been made possible so far with said conventional LMIS sources. According to the present invention, any conventional focused ion beam system can be easily adapted to use such novel high brightness point ion sources.

BACKGROUND OF THE INVENTION

Till today, almost all industrial point ion source applications are based upon liquid metal ion sources (LMIS), which gave rise in the 1970–1980 period to the spectacular explosion of focused ion beam (FIB) technology. In comparison to all other types of ion sources, LMIS sources exhibit quite excellent optical qualities (brightness and low energy spread) that allow the FIB systems incorporating the same to focus ionic spots of sub-micronic sizes with high current densities in the order of several $A/cm_2$ that are well adapted to industrial applications. In particular, FIB systems are extensively used in the micro-electronic field, for the modification, reconfiguration, failure analysis and manufacturing of advanced semiconductor products, typically integrated circuits (ICs) and the surface analysis thereof. However, if LMIS sources are at the historical origin of the FIB technology expansion, they have inherent physical constraints which considerably limit the potential applications of FIB systems and scientific instruments derived therefrom. With LMIS sources, the ionizable source materials that can be used for ion generation are limited to a few pure metals and to some metal alloys. For reasons of reliability and of optical qualities, the most commonly used metal is gallium. Despite some recognized advantages, the use of LMIS sources in standard FIB systems exhibits some considerable limitations and inconveniences that are recited below.

First of all, there is no chemical reactivity effect associated with the collision process of sputtering (ionic bombardment) unlike in a conventional reactive ion etching process for example. This limits the removal rate of most of the most commonly used target materials to 1–4 sputtered atoms per incident ion at energies of about 30 kV. Because there is no by-product gas formation, the sputtered atoms are not evacuated during the process and a re-deposition of the sputtered materials near the attacked areas occurs. This undesired re-deposition is complicating many FIB based etching processes. In particular, if the redeposited material is of the conductive type it can create parasitical connections on the semiconductor product. Moreover, re-deposition of the sputtered material reduces the achievable sidewall angle, and thus results in aspect ratios of etched holes no greater than approximately 6:1. Etching a deep trench thus requires a lengthy process and can produce undesired damages to the hole neighboring areas.

Another consequence of this lack of chemical reactivity can be found in an analysis technique currently referred to as the SIMS (SIMS is an acronym for Secondary Ion Mass Spectrometry). This technique can be based on the use of gallium probes and has a recognized high local resolution (an important requirement of focused ion beam applications), so that such SIMS systems reach a local resolution of some tens of nanometers. However, one of the conditions for quantitative SIMS analysis is to have a high secondary ion emission yield. Because gallium doesn't have any important effect of secondary ion yield stimulation, but has a high local resolution, the benefit of small sized gallium probes is balanced by the small emission rate of the secondary ions to be analyzed. On the contrary, commercially available SIMS systems using other ions which associate a chemical effect in addition to the collision effect of sputtering in order to enhance the secondary ion yield, unfortunately have a poor local resolution. In particular, cesium (Cs), which is one of the most chemically reactive metals, considerably enhances the secondary ion yield. Industrial SIMS systems may employ classical Cs sources (generally of the surface ionization type), but the brightness of these ion sources is low and thus cannot be compared with those of Ga LMIS sources. Moreover, the violent reactivity of cesium also makes its handling very difficult. Many attempts to produce Cs LMIS sources have been conducted in research laboratories, but because of the high chemical reactivity of cesium, Cs LMIS sources have never reached the acceptable reliability level that is required by SIMS systems used in the industry.

Finally, for example in applications such as quantum device fabrication, it is difficult to reduce the creation of ion beam-induced defects on the sample by a simple reduction of the ion beam energy, because this operation involves a very important loss in terms of current density, the machining time is significantly increased, and finally results in a costly process.

An attempt to solve the problem of the violent chemical reactivity of alkaline metals has been described in the article: Lithium ion emission from a liquid metal source of $LiNO3$, by A. E. Bell et al, published in the International Journal of Mass Spectrometry and Ion Processes, 88 (1989), pp 59–68. These authors conducted experiments with ion sources similar to LMIS sources. They substituted the alkaline metals with chemical compounds containing these metals. In particular, they produced a Li+ ion beam with a source using a pure molten binary salt, in this case the lithium nitrate ($LiNO_3$). For these experiments they used a needle coated with this molten salt which was heated as standard and they called their ion sources "liquid metal ion sources of $LINO_3$", i.e. a variant of LMIS sources. They observed the generation of gas bubbles and very fast evaporation of the said molten salt. Measuring the energy distribution of the emitted ions with a retarding potential analyzer, they found a FWHM (full width at half maximum) energy spread of 110 eV which was comprised of two peaks. They concluded that this was due to the participation of gas-phase field ionization in addition to field desorption on the apex of the needle tip. Ion sources with such a large spread in energy distribution are unsuitable for use in industrial FIB systems because the focusing of the ion beam is roughly limited by chromatic aberrations.

On the other hand, in some advanced fields of microanalysis, such as proton microscopy, ion beam lithography (no proximity effects for small structures and very high resist sensitivity to ions), localized Rutherford back-scattering analysis (RBS) and particle induced X-ray emission analysis (PIXE) with very high spatial resolution, the generation of protons (the known lightest ion) is quite impossible to obtain with FIB systems using conventional LMIS sources. As a matter of fact, if many attempts have been done to realize focused proton beam columns, these efforts have never ended in successful industrial applications. They often used field ionization sources in gas phase. In this particular case, the ion source generally consists of a tungsten needle that is cooled with liquid helium at a temperature of a few Kelvin degrees. A flux of hydrogen atoms is generated by field-ionization at the needle tip. These ion sources have a great theoretical brightness but imply sophisticated and thus expensive equipments. In addition, they have a very poor reliability and a low total ion current.

Consequently, it would be extremely interesting, especially for SIMS analysis of integrated circuits (ICs), but also for many other applications, to realize novel high brightness point ion sources for improved FIB systems. Such ion sources must retain the qualities of conventional LMIS sources in terms of pin-point emission characteristic and current density (brightness), but now offering a greater range of ion species, including but not limited to, alkaline metals and halogens. Finally, it would be also worthwhile to realize such novel high brightness point ion sources capable to work with ionizable source materials selected among liquid ionic compounds to benefit from the existence of pre-existing ions therein and to avoid the use of chemically very reactive and dangerous species such as $Cs^+$ or $C^-$ ions. The present invention provides high brightness point ion sources adapted to work with liquid ionic compounds that meet all these requirements and thus present significant improvements and advantages in comparison with conventional LMIS sources.

SUMMARY OF THE PRESENT INVENTION

According to the present invention, there is first described novel high brightness point ion sources that are adapted to operate with a wide range of ionizable source materials, that are ionic compounds in the liquid state, referred to hereinbelow as liquid ionic compounds. Typically, liquid ionic compounds in consideration include mixtures (eutectic or not) of molten salts, bases or acids. Generally, mixtures of salts require to be heated up to their melting point temperature to reach this liquid state, unlike bases and acids that are liquid at room temperature. A wide range of positive and negative ions of highly chemically reactive ion species (e.g. halogens, alkaline metal radicals and the like) and even protons become available. Because the ions are pre-existing in the liquid ionic compound, the ion emission mechanism onset only requires low extraction voltages (2,5 to 3,5 kV).

A typical novel high brightness point ion source of the present invention is basically comprised of two parts: the needle assembly and the extraction assembly. The needle assembly consists of a point shaped needle made of a refractory ceramic material, whose sharpened extremity is referred to as the tip. The needle is heated by a coil made of stainless steel or other suitable material which is tightly wound on a portion of the needle adjacent to the tip. The other extremity of the needle is lodged in a recess of an insulating support which is provided with two pins cast therein. Each extremity of the coil is welded to a pin. The pins are connected to a heating current supply. The extraction assembly is comprised of a circular extracting electrode provided with a central aperture that is screwed on a cylindrical body, so that the spacing between the tip apex and the center of the aperture is adjustable. The extraction electrode and the cylindrical body are both made of metal. The needle assembly is mounted inside the cylindrical body and accurately affixed thereto by centering screws. An extraction voltage supply applies a potential difference between the extraction assembly and the coil. Before usage, the needle assembly is coated with the liquid ionic compound, for instance by dipping in a crucible containing the liquid ionic compound. The whole surface of the needle is wetted with the said liquid ionic compound and a reservoir thereof is formed at the coil location. The needle assembly is then inserted in the extraction assembly and appropriately fixed therein. The high brightness point ion source is then ready for use in a FIB column. The present invention further encompasses a modified focused ion beam column for adaptation to the novel high brightness point ion sources. In particular, the modified focused ion beam column of the present invention is provided with a system adapted to apply reversible polarities to some or all electrical components of the FIB system (source voltages, electronic lenses, deflecting electrodes and the like) in order to work with ion beams of either positive or negative type.

Therefore, the novel high brightness point ion sources of the present invention not only retain most of the advantages of the conventional LMIS sources and in particular the same brightness, but add significant improvements thereto, so that they can be advantageously used in almost all industrial FIB applications known to date.

OBJECTS OF THE PRESENT INVENTION

Therefore, it is a primary object of the present invention to provide novel high brightness point ion sources using liquid ionic compounds which consists of mixtures, e.g. mixtures of molten salts, acids or bases.

It is another primary object of the present invention to provide novel high brightness point ion sources using liquid ionic compounds wherein the emitting needle is made of a refractory ceramic material that can be heated either directly or indirectly.

It is another object of the present invention to provide novel high brightness point ion sources using liquid ionic compounds which consists of mixtures of molten salts, acids or bases that have a low vapor pressure and a low melting point temperature.

It is another object of the present invention to provide novel high brightness point ion sources that are adapted to use liquid ionic compounds which preserves the desired high brightness, pin-point emission and low energy spread of standard LMIS sources.

It is another object of the present invention to provide novel high brightness point ion sources using liquid ionic compounds that are adapted to produce a large spectrum of highly chemically reactive ion species including alkaline metals and halogens.

It is another object of the present invention to provide novel high brightness point ion sources using liquid ionic compounds that have pre-existing ions for intense positive and negative ion emission.

It is another object of the present invention to provide novel high brightness point ion sources using liquid ionic compounds that are adapted to produce protons.

It is another object of the present invention to provide a process for generating ions in FIB columns with such novel high brightness point ion sources using liquid ionic compounds.

It is still another object of the present invention to provide improved FIB systems that are adapted to such novel high brightness point ion sources using liquid ionic compounds to produce beams of new ion species with high local resolution and spots of very sub-micronic sizes.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DESCRIPTION OF THE PREFERRED EMBODIMENTS

Figure 1:
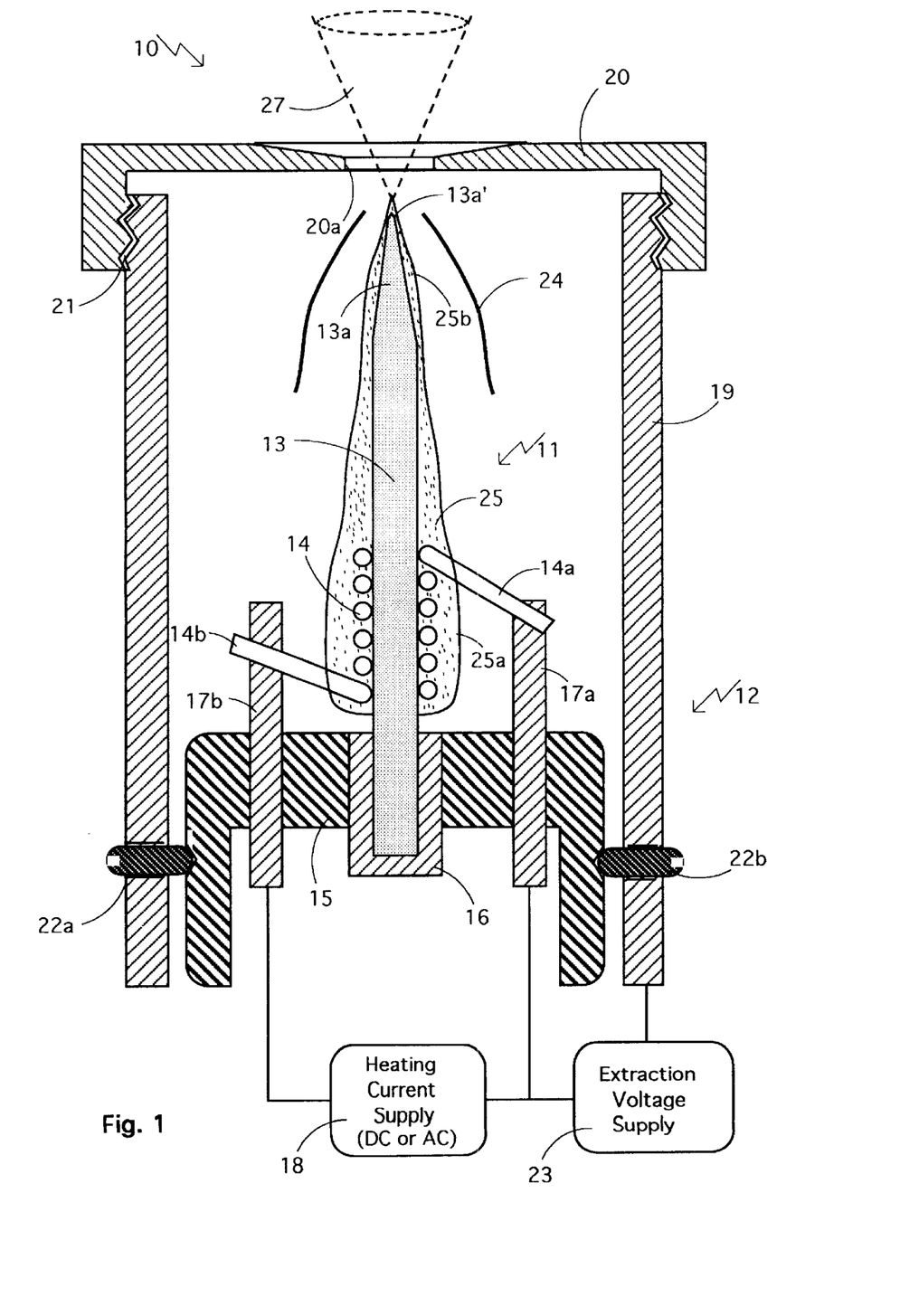
FIG. 1 shows a schematic view of a first embodiment of the novel high brightness point ion source of the present invention with direct heating of the liquid ionic compound by a heating coil.

FIG. 1 shows a schematic view of a first embodiment of the novel high brightness point ion source with direct heating of the liquid ionic compound according to the present invention. Now turning to FIG. 1, the ion source 10 basically consists of two essential parts: the needle assembly 11 and the extraction assembly 12 which includes the extraction means that are required for ion emission and preferably forms a housing for the needle assembly 11. In this embodiment, the needle assembly 11 comprises the needle 13, an heating coil 14 whose two extremities are referenced 14a and 14b and a plate-shaped or cup-shaped supporting base 15. Typically, the heating coil 14 is made of stainless steel or platinum. As apparent from FIG. 1, one extremity of needle 13 is point-shaped forming needle tip 13a. Preferably, the needle 13 is made of a refractory inert material, such as a ceramic, including alumina ($Al_2O_3$) and zirconium oxide ($ZrO_2$). One major reason for the choice of a ceramic material instead of a metal, is to avoid gas bubble formation, chemical/electrolytic erosion or electro-deposition of electrolytic by-products on the needle 13 that would be generated during the ion source 10 normal operation. As a result, the undesired instabilities of the emission region position (near the tip apex 13a' where the critical ionization phenomena takes place) that would then occur, are thereby eliminated. Still in this preferred embodiment, the supporting base 15 is made of an insulating material (e.g. alumina) having a central opening adapted to receive an hollow member 16 that is provided with a recess as illustrated in FIG. 1. The needle 13 is lodged in the recess. Supporting base 15 is further provided with two conductive pins 17a and 17b or the like that are partially cast therein. Each extremity (14a, 14b) of the heating coil 14 is joined, e.g., welded to the top portion of its respective pin (17a, 17b) to ensure an excellent electrical contact therebetween. On the other hand, the bottom extremity of pins 17a and 17b is connected to the respective terminal of a (DC or AC) heating current supply referenced 18. The latter generates the appropriate current in heating coil 14 to raise the needle 13 to the adequate temperature whenever required. To avoid thermal shocks, current supply 18 is adapted to generate a variable current, so that the needle 13 is progressively raised to the said adequate temperature. Instead of using the above described heating coil, other techniques of heating the needle may be envisioned as well, including electron bombardment, photon heating, in-tip heating and the like. Finally, still in this embodiment, the extracting assembly 12 comprises a cylindrical body 19 made of stainless steel and a cup-shaped extracting electrode (or extractor) 20 made of tantalum that is provided with a central aperture 20a. Extracting electrode 20 which has a generally circular shape is tightly affixed on the cylindrical body, e.g. by screwing, to form the cover thereof. To that end, as illustrated in FIG. 1, the external surface of the cylindrical body 19 top portion and the interior surface of the extracting electrode 20 rim are threaded at location 21. The gap between the tip apex 13a' and the center of extracting electrode aperture 20a is thus accurately adjustable. The aperture diameter is about 1 mm and the distance between the tip apex and the edge of the aperture 20a is about 0,5 mm. The extracting assembly 12 is secured to the supporting base 15 by a set of screws 22a and 22b or any other appropriate fastening means, forming thereby a housing for the needle assembly 11. Screws 22a and 22b allow a perfect centering of the needle assembly 11, and in particular of the tip apex 13a', with regard to aperture 20a of extracting electrode 20. In operation, the cylindrical body 19 will be connected to the first terminal of an extraction voltage supply 23 and the other terminal of extraction voltage supply 23 will be connected to any one of said conductive pins, for instance, to the bottom portion of pin 17a. Voltage supply 23 is adapted to apply a variable extraction voltage V, so that the ion emission can be varied. Optionally, an anti-deposition shield 24 may be mounted inside the housing to increase the ion source 10 life time and to prevent the extracting electrode 20 at the vicinity of aperture 20a from being contaminated by the deposition of the evaporated ionic compound.

Let us now describe the fabrication of the novel high brightness point ion source 10. First of all, the needle 13 is fabricated. In a preferred embodiment, the starting material is a 0,5 mm diameter ceramic ($Al_2O_3$) rod, such as supplied from DEGUSSA, Courbevoie, France. A piece of about 1 cm is cut with a diamond saw and one extremity thereof is sharpened on a length of about 1 mm using for instance a diamond grinding plate. The half-angle of the tip apex is preferably equal to or less than about 60° to avoid instabilities in the emission point. The radius of curvature of the tip 13a is preferably equal to or less than 100 $\mu$m, a typical value being 10 $\mu$m. The radius value does not appear to be a critical parameter in the present instance. Experiments that have been conducted by the inventors have shown that half-angles of 20° and of 49,3° (the exact value of the Taylor's cone) are adequate. Next, the heating coil 14 is prepared from a 0,3 mm diameter wire of stainless steel as standard. For instance, the stainless steel that is commercially available from WEBER métaux, 9 rue de Poitou, Paris, FRANCE under part-number 304L is appropriate. The wire is tightly wound around needle 13 or the needle 13 is inserted in the coil 14 by force to form the needle assembly 11 as illustrated in FIG. 1. The needle assembly 11 is then inserted in the recess of hollow member 16 and firmly secured therein. Each extremity (14a, 14b) of heating coil 14 is welded to its corresponding pin (17a, 17b) within insulating support 15. Pins 17a and 17b will be subsequently electrically connected to a heating current supply referenced 18 to have ion source 10 operative. The needle assembly 11 is now ready to have the needle and in particular its tip portion coated with a thin film of an adequate ionizable source material.

According to the present invention, such ionizable source materials consist of liquid ionic compounds and more particularly of mixtures thereof, such as mixtures of salts, bases or acids. As far as salts are considered, mixtures of salts (eutectic or not) have a melting point and a vapor pressure that are lower than those of pure binary salts. Pure binary ionic compounds generally have relatively high vapor pressures that would certainly cause some serious problems, e.g. a fast evaporation of the source material, ion emission instabilities, and a large spread in the energy distribution that would be caused by field ionization in the vapor phase as reported by A. E. Bell in the foregoing reference.

Let us first consider the case of a mixture of salts for illustration, for instance a mixture of $CsNO_3$ and $CsCl$. Pure binary salts are generally available in powder or in granulate form. First of all, the salts are mixed in a crucible according to the optimal proportion, i.e. close to the eutectic composition. The latter is generally available from tables, and if not, it is experimentally determined. In the above example, this optimal proportion, by weight, which was determined by the inventors through a few experiments is approximately 82% and 18% respectively. The crucible is raised to the melting point temperature of the mixture. It is to be noted that if acids and bases are often liquid at room temperature, on the contrary, salts generally require to be heated at their melting point temperature to be in the liquid state. An homogeneous mixture of molten salts forms naturally in the crucible, so that the bath does not require any stirring.

A thermodynamic equilibrium between the needle and the mixture of molten salts is desirable. Now, the needle assembly is dipped in the crucible to have the totality of the exposed needle surface in contact with the mixture of molten salts. Because, as soon as the needle comes in contact with the mixture of molten salts, adhesive surface forces produce a coating layer 25 of the mixture which flows along the needle to cover its whole surface and remain thereon even when the needle assembly 11 is held upside down. As apparent from FIG. 1, the coating layer 25 of the mixture of molten salts which wets the needle is comprised of two parts: a first part forming a reservoir 25a at the location of the heating coil 14 and a second part consisting of a thin film 25b covering the remaining surface of the needle and in particular the tip 13a. The ceramic materials and in particular those cited above have excellent wetting capabilities. Alternatively, in another embodiment, the unheated needle may be dipped in the crucible to be coated by said thin layer 25 which solidifies as soon as the needle is removed therefrom. Same approach applies when acids or bases are used, except that no heating thereof is normally required. The quantity of the liquid ionic compound that is collected at the heating coil 14 location to form reservoir 25a is of about a few $mm^3$. The needle assembly 11 is then removed from the crucible and let cooled. In a preferred embodiment, the needle 13 is coated with the ionic compound before the ion source 10 is placed in the FIB column. Thereafter, the needle assembly 11 is connected to the heating current supply 18 and the needle gently heated until the melting temperature of the mixture is reached to avoid any thermal shock.

If the liquid ionic compound is a mixture of salts as described above, the coating layer 25 remains in situ in a crystallized state after solidification of the salts. All the above steps of dipping, removing and cooling can be achieved in the ambient atmosphere unlike LMIS sources which require any coating operation be made in a high vacuum.

Next, the extracting assembly 12 is prepared. Cylindrical body 19 consists of a stainless steel cylinder that is provided with adequate pumping apertures (not shown), e.g. on the lateral sidewall to allow a sufficient vacuum to take place in the interior space of point ion source 10. Extracting electrode 20, preferably made of tantalum, is affixed on the cylindrical body 19 by screwing as mentioned above to be integral therewith and form a protective housing for the needle assembly 11. Finally, the needle assembly 11 is inserted in extraction assembly 12 and then secured therein by screws 22a and 22b. These screws are also used to obtain a perfect centering of the tip apex 13a' with respect to the aperture 20a. Finally, the gap between the extracting electrode 20 and the tip apex 13a' is accurately adjusted. The ion source 10, with its coating of source material (possibly heated if the ionic compound is of the solid type at room temperature) is now ready to use in a vacuum column such as a FIB column.

Figure 2:
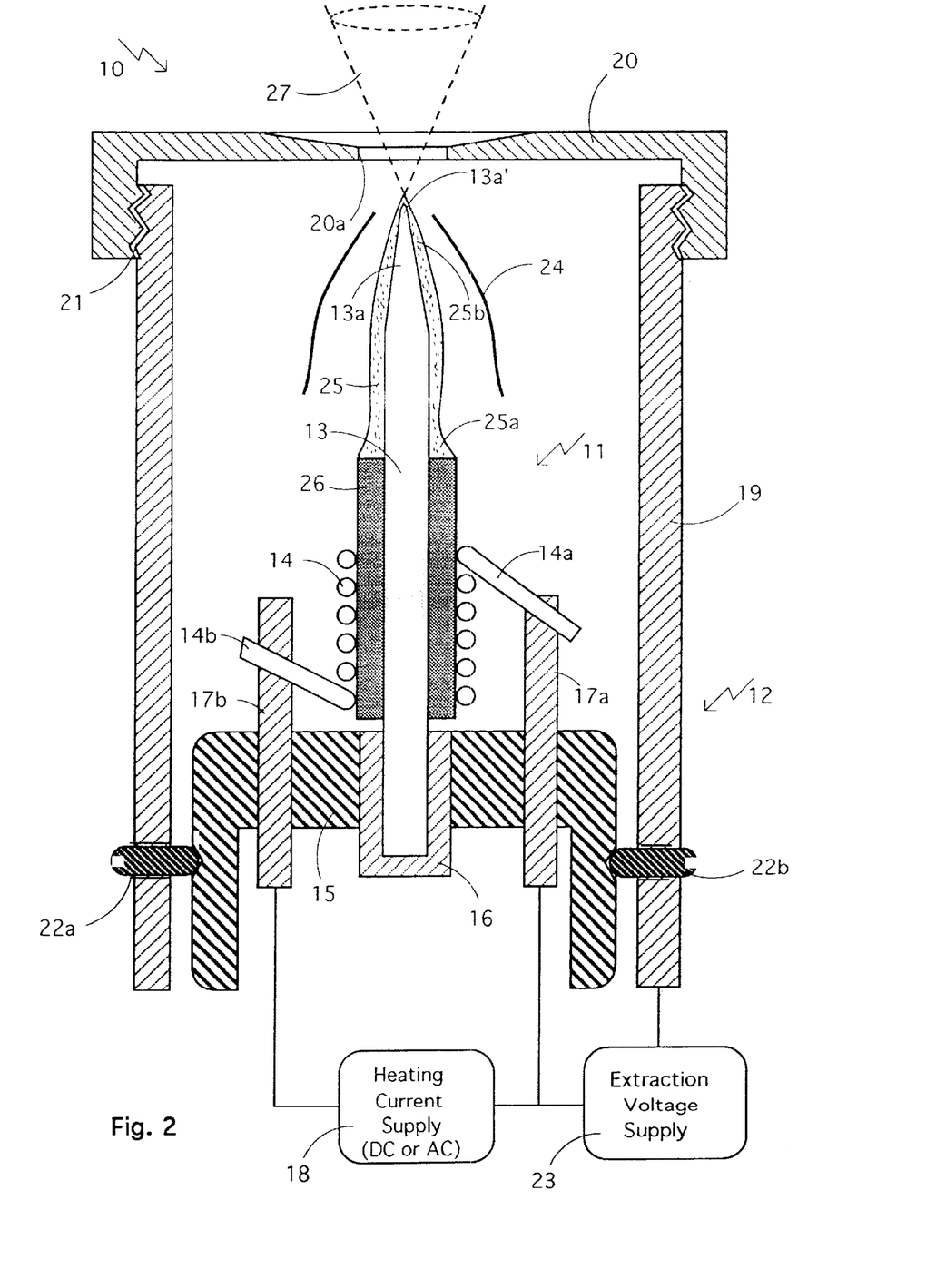
FIG. 2 shows another embodiment of the novel high brightness point ion source of the present invention implementing an indirect heating technique using a graphite mandrel so that the liquid ionic compound is no longer in contact with the heating coil.

FIG. 2 shows another embodiment of the ion source 10, that is preferred for ionizable source materials that are highly chemically reactive to prevent any detrimental effect that would occur between the metal forming the heating coil 14 and the liquid ionic compound, is provided. To that end, an intermediate mandrel made of a material that is electrically and thermally conductive, but poorly wetted by the liquid ionic compound, is provided. Graphite is adequate in all respects. The mandrel is referenced 26 in FIG. 2. Fabrication of the FIG. 2 embodiment directly derives from the construction described above by reference to FIG. 1.

Because, the high brightness point ion sources 10 of the present invention employ liquid ionic compounds and preferably mixtures of molten salts, bases or acids, they will be referred to hereinbelow by the acronym LICIS which stands for Liquid Ionic Compound Ion Sources for analogy with the term LMIS which stands for Liquid Metal Ion Sources. For instance, as far as alkaline metal ion sources are concerned, the two following mixtures of ionic compounds have been successfully employed. The mixtures $CsNO_3$ (82%) and $CsCl$ (18%), by weight, on the one hand, and $NaNO_3$ (70%) and $NaCl$ (30%), by weight, on the other hand have revealed to be adequate for the generation of $Cs^+/Cl^-$ and $Na^+/Cl^-$ ions respectively, i.e. alkaline metal and halogen ions that are highly chemically reactive. The mixture $H_3PO_4$ (80%) and $H_2SO_4$ (20%), by weight, provides an excellent source of protons $H^+$. The nature and the polarity of the extracted ions depends on the polarity of the extraction voltage V applied by voltage supply 23, as will be explained in more details hereinbelow.

The thermoionic emission mechanism of LICIS sources is relatively simple because they use ionic compounds which already contain pre-existing ions, therefore, no separate ionization process is required. As a consequence, low extraction voltages (2,5 to 3,5 kV) are now possible as well as positive and negative ion emission. In addition, a wide range of highly chemically reactive ion species including alkaline metals and halogens and even protons become now available. Finally, LICIS sources which use these mixtures are easily manipulated in vacuum and in the ambient atmosphere as well. Moreover, they have an acceptable life time. All these advantages of the novel high brightness point ion sources of the present invention are of significant importance in many industrial FIB applications.

Let us now consider the LICIS source 10 in normal operating conditions when placed in the vacuum column of a conventional FIB system and properly secured therein. The LICIS source 10 can be designed to directly fit in the FIB column or the latter may be slightly modified for perfect adaptation. The FIB column consists of several electrostatic lenses, a mass filter (e.g. a Wien filter) and the like as standard. Let us still assume the liquid ionic compound is a mixture of salts as mentioned above for consistency. First, the needle assembly 11 is connected to the heating current supply 18 to have the needle 13 heated to the melting point temperature of the salt mixture using either embodiment of FIG. 1 or FIG. 2, until the coating layer 25 of solidified salts which was remaining onto the needle 13 after fabrication of the LICIS source 10 becomes liquid. Salt mixtures are generally in a crystallized phase at the surface of needle 13 after cooling as mentioned above unlike mixtures of bases and acids that are generally liquid at room temperature. An extraction voltage V is applied between the extracting assembly 12 and the mixture of molten salts by voltage supply 23. Because, the cylindrical body 19 and the extracting electrode 20 that compose the extracting assembly 12 are made of metal, they are at a first potential (V1). On the other hand, it is important to be reminded that a salt or a mixture of salts is electrically conductive in the molten state. Therefore, the coating layer 25 and the coil 14 form a counter electrode (with respect to extracting electrode 20) which is at a second potential (V2). The value of the extraction voltage V (V=V1−V2) is progressively increased as usual. As soon as the threshold voltage value Vt is reached, ion beam emission appears and the ion beam is extracted as illustrated by solid angle 27 in FIGS. 1 and 2. The extraction voltage V is of a few kilovolts, from about 2,5 to about 3,5 kV, i.e. much lower than with LMIS sources in same operating conditions (in the 5 to 8 kV range). When the salt mixture is brought to a positive potential compared with the extracting electrode 20, a beam of positive ions is extracted, under the influence of the strong electrostatic field which is created by the extraction voltage at the tip apex 13a' coated by said thin film of the liquid ionic compound. The liquid cone which is formed (similar in all respect to the Taylor's cone) produce a pin-point emission. This point emission combined with a very high supply function inside the liquid ionic compound directly results in the high brightness pin point sources of the present invention, comparable in that regards with the best Ga LMIS sources (up to about $10^6$ A/cm$^2$/sr with an energy spread less than 5 eV). In addition, the use of a needle 13 made of a ceramic material avoids the electro-chemical reactions which usually occur between the tip and the ionizable source material. On the other hand, emission instabilities due to the formation of undesired electro-chemical by-products are also eliminated. Finally, LICIS sources are stable and have very high reliability and long life time.

More generally, let us assume an ionic compound in the mixture having the general formula $A^+$–$B^-$. In the case of a salt, such as NaCl, where A represents the alkaline metal and B the halogen, it has been noticed that an important part of the positive ion beam is composed of metal Na+ ions. On the other hand, in the case of an acid such as $H_2SO_4$, it has been made possible to form beams of protons $H^+$. Now, if the polarity of the extraction voltage supply 23 is reversed, negative ions are generated instead. For instance, using salts such as NaCl or $CsNO_3$, it is possible to generate negative ions Cl$^-$ or molecular ions $NO_3^-$ respectively.

As a result, if there are some analogies between the structure of the novel LICIS sources of the present invention and the conventional LMIS sources, some essential differences remain. In both cases, in operation, the needle is covered by a thin film of a ionizable source material in the liquid state which is submitted to a high electrostatic field at the tip apex just in front of the extraction electrode. But, contrarily to said conventional LMIS sources, LICIS sources employ liquid ionic compounds instead of liquid metals as the ionizable source materials. Consequently, the physic of ion emission is very different as it will be now explained.

The ion emission occurs in the thin film region which covers the tip apex 13a'. Under the influence of the electrostatic field, the formation of a small cone-shaped protuberance or cusp which seems to be very similar to the cone previously observed and reported by Taylor and well-known in conventional LMIS sources has been notices. This protuberance is the result of an equilibrium between electrostatic forces and surface tension. The presence of this protuberance ensures a pin-point ion emission and thus provides LICIS sources with the highly desirable brightness. Still referring to the above described example using a $CsNO_3$/CsCl mixture, a brightness as high as $10^6$ A/cm$^2$/sr has been obtained, i.e. very comparable to the best values obtained with conventional Ga LMIS sources. This is due to high supply function in liquid ionic compounds.

This interpretation made in accordance with the Taylor's model, is confirmed by the existence of a threshold field associated with the threshold voltage Vt mentioned above. The ion emission starts at a current of about 1 $\mu$A or less. The threshold for the extraction voltage is of about 2,5–3,5 kV for the LICIS sources 10 of the present invention and it is remarkable to notice that the same value is obtained for either positive or negative ion beams. This corroborates the assumption of a cone-like structure comparable to the Taylor's cone, because the electrostatic energy which is proportional to the square of the electrostatic field produced between extracting electrode 20 and the thin film 25b at the tip apex 13a' does not depend on its polarity.

The possibility of negative ion emission is another important characteristic of LICIS sources 10 that use liquid ionic compounds, a result which was not achievable with LMIS sources. If the polarity of an LMIS source is reversed, an intense uncontrollable electron field emission will start immediately after the formation of the Taylor's cone. This is due to the fact that the electrostatic field that is necessary to produce electron emission is one order of magnitude lower than the critical field that is necessary to extract negative ions from liquid metals. As a consequence, an undesired "explosive" electron emission starts that masks the negative ion emission. On the contrary, with LICIS sources, the reaction of liquid ionic compounds to the electrostatic field produces only an ion emission because there is no electron gas and therefore no possibility of electron field emission. From the threshold voltage and upwards, LICIS sources produce an emission of positive or negative ion beams depending on its bias polarity.

The mechanism of positive or negative ion extraction in LICIS sources is probably a field evaporation of pre-existing ionic species in the strong electrostatic field on top of the protuberance mentioned above. Despite some analogies with LMIS emission, the emission mechanism of LICIS sources is thus very different from the metal field evaporation that occurs in the LMIS emission, because ions are already pre-existing in the liquid ionic compounds before any external electrostatic influence.

The properties of the LICIS sources and their advantages when compared to conventional LMIS sources will be now illustrated by reference to FIGS. 3 and 4.

Figure 3:
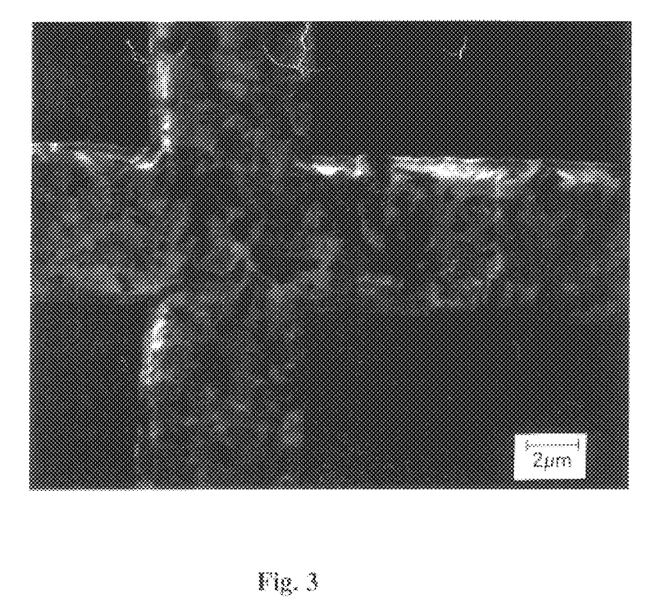
FIG. 3 is a micro-photograph showing the secondary electron image of a copper grid deposited on an aluminum substrate when scanned by a focused Cl⁻ion beam.

FIG. 3 is a micro-photograph which shows the secondary electron image of a specimen consisting of a 6 $\mu$m wide copper grid formed onto an aluminum substrate when scanned by a focused beam of negative ions, in this instance, Cl⁻ ions generated by the LICIS source of the present invention. As apparent from FIG. 3, sub-micronic details can be neatly observed (the scale is 2 µm). It is remarkable to notice that no similar images have ever been obtained so far with LMIS sources, because they are unable to generate negative ions, in particular such as Cl⁻ ions.

Figure 4:
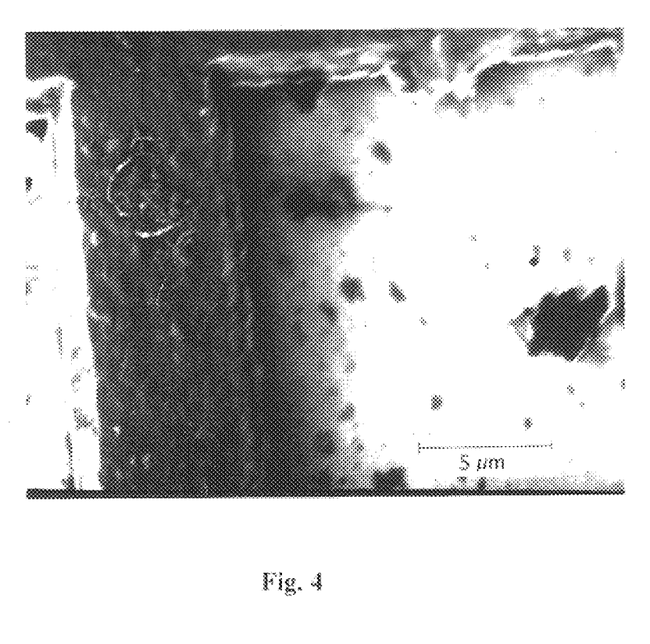
FIG. 4 is a micro-photograph showing the secondary electron image of a copper grid deposited on an aluminum substrate when scanned by a focused Cs⁻ion beam with a 5 kV energy.

FIG. 4 is a micro-photograph which shows the secondary electron image of the same specimen but now obtained with Cs+ ions, with a low energy beam of 5 kV, a value that is significantly inferior to the lower limit of the energy usually required with conventional LMIS sources for the same resolution. The images of FIGS. 3 and 4 are showing a spatial resolution which is comparable to the resolution obtained with Ga LMIS sources.

In summary, the brightness of LICIS sources is at least equal or even better (at low energies) than the brightness of the best Ga LMIS sources, with the interesting possibility of offering a wide range of new ionic species: alkaline metals, halogens, protons, etc . . .

The new LICIS sources of the present invention are still adapted to meet most of the applications of the conventional LMIS sources in focused ion beams which involve physical interactions between ion probe and the specimen. For instance, one may cite the local ion beam micro-milling of a solid target that is worthwhile in applications such as: IC repair, failure analysis of ICs and reconfiguration by cutting micro-fuses. Sample preparation for Auger analysis, high resolution SEM or TEM can be done by milling bevels, cross-sections, or thin foils. Another application is in the field of scanning ion microscopy which visualizes the sample by detection of either secondary electrons or secondary ions emitted by the impact of the scanned focused ion beam. Still other applications can be found in the local target analysis by identification of sputtered species (e.g. in the SIMS technique), and the local modification of electrical properties of semi-conductors by ion implantation and the local modification of chemical bonds (ion beam lithography, doping of polymers and semiconductors). The LICIS sources of the present invention are thus opening a new range of possible applications of FIB systems.

Let us first consider the case of liquid ionic sources that produce chemical reactive ions. As far as halogen ions are concerned, users of FIB systems equipped with Ga LMIS sources often inject reactive halogen-based gases (such as $Cl_2$ or $XeF_2$) to obtain chemical effect associated with the collision process of sputtering (gas enhanced etching). LICIS sources use these reactive elements directly as incident ions avoiding thereby the use of those highly reactive gases that are known to be dangerous and corrosive. The use of chemically reactive species such as halogen ions has a number of advantages. First of all, the removal rate of most target materials is considerably increased, so that the machining time gets shorter and throughput will become higher. Secondly, the halogen ions react chemically with the sputtered materials and form in many cases gaseous by-products which are eliminated by the pumping system. This way, the use of LICIS sources reduces re-deposition of sputtered materials near the attacked areas. Finally, the high selectivity of some halogens (for instance, fluorine compounds etch insulators at a faster rate than metals such as aluminum) allows to open windows for operations on buried structures of ICs, without damaging parts thereof. If we now consider the case of alkaline metal ions, cesium, which is one of the most chemically reactive metals, enhances considerably the secondary ion yield. This is very important for the applications of the LICIS sources in SIMS analysis. To get good quantified SIMS analysis results it is necessary to have a high primary ion beam current and primary ion species which give a high secondary ion yield. On the other hand, especially in micro-electronics, it is very important to reach a high spatial resolution on the specimen to be analyzed. This requests a well focused primary ion beam. The use of LICIS sources in a FIB column combines all these qualities : cesium ions and high ion beam current in a very sub-micronic probe (down to 25 nm).

If we now consider the particular case of protons, it is worthwhile to notice that LICIS sources of the present invention are providing bright proton sources which are opening a wide range of possible applications. For instance, in the field of proton microscopy, ion beam lithography (no proximity effects for small structures and very high resist sensitivity to ions), localized Rutherford back-scattering analysis (RBS), and particle induced X-ray emission analysis (PIXE) with very high spatial resolution, that are impossible to obtain with conventional technologies to date are possible with the LICIS sources of the present invention.

Finally, it may be desirable for many applications to work with low energy beam, for example to reduce the creation of ion beam-induced defects during TEM specimen preparation. LICIS sources are working at about two times lower extraction voltages than classical LMIS sources. This allows to work at beam energies down to 2,5–3,5 kV without retarding the beam (beam retarding would involve a very important loss of current density and a subsequent increase of machining time).

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A high brightness point ion source (10) adapted to work with an ionic compound that has a liquid state comprising:
  a) ion emitting means (11) including:
    an ionic compound that has a liquid state selected from the group consisting of a mixture of salts, a mixture of acids and a mixture of bases; a needle (13) made of a refractory ceramic material, adapted to be wetted with said liquid ionic compound, that is provided with a point shaped extremity referred to as the tip (13*a*) having an apex (13*a*'); and, means (15) for supporting the needle; and,
  b) ion extracting means (12) including:
    an extracting electrode (20) made of a conductive material that is provided with an aperture (20*a*); and, means for maintaining an accurate relationship between said extraction electrode and the apex (13*a*') of said tip.

2. The high brightness point ion source of claim 1 wherein said ion emitting means further comprises heating means (14) coupled to the needle for heating the needle to a temperature equal to or just above the melting point temperature of said ionic compound.

3. The high brightness point ion source of claim 2 wherein said heating means consists of a heating coil tightly wound around the needle at a location of the needle that is adjacent to the tip.

4. The high brightness point ion source of claim 3 wherein said heating means is adapted to collect a small quantity of the liquid ionic compound to create a reservoir (25*a*) of said ionic compound from where the latter is capable to flow and wet the tip with a thin film (25*b*) thereof.

5. A high brightness point ion source (10) adapted to work with an ionic compound that has a liquid state comprising:
  a) ion emitting means (11) including:
   a needle (13) made of a refractory ceramic material, adapted to be wetted with said liquid ionic compound, that is provided with a point shaped extremity referred to as the tip (13a) having an apex (13a'); means (15) for supporting the needle; and, heating means (14) coupled to the needle for heating the needle to a temperature equal to or just above the melting point temperature of said ionic compound, wherein said heating means consists of a heating coil tightly wound around the needle at a location of the needle that is adjacent to the tip; and a mandrel (26) made of a thermally and electrically conductive material not easily wettable by the liquid ionic compound is disposed intermediate the coil and the needle to prevent any chemical reaction between the material forming the coil and the liquid ionic compound; and
  b) ion extracting means (12) including:
   an extracting electrode (20) made of a conductive material that is provided with an aperture (20a); and, means for maintaining an accurate relationship between said extraction electrode and the apex (13a') of said tip.

6. The high brightness point ion source of claim 5 wherein said mandrel is made of graphite.

7. The high brightness point ion source of claim 1 wherein said means for supporting the needle comprises an insulating support provided with (i) a hollow member (16) having a recess where the needle is secured and (ii) two pins (17a, 17b) cast therein whose extremities are joined to respective extremities of the heating coil.

8. The high brightness point ion source of claim 1, wherein said ion extracting means further comprises a cylindrical metallic body (19) and wherein said extracting electrode has a general circular shape and is affixed on said cylindrical metallic body (19) to form a housing for the ion emitting means.

9. The high brightness point ion source of claim 8 wherein said ion emitting means is mounted inside said cylindrical metallic body and tightly secured therein by adjustable centering means (22).

10. The high brightness point ion source of claim 8 wherein said extracting electrode and cylindrical body are provided with adjustable means (21) so that the spacing between the aperture center of the extracting electrode and the tip apex of the ion emission means can be accurately adjusted.

11. The high brightness point ion source of claim 1, wherein said refractory ceramic material is selected from the group consisting of alumina ($Al_2O_3$) and zirconium oxide ($ZrO_2$).

12. The high brightness point ion source of claim 1 further comprising an anti-deposition shield (24).

13. The high brightness point ion source of claim 1 wherein said mixture of salts is a mixture of $CsNO_3$ (82 weight %) and CsCl (18 weight %).

14. The high brightness point ion source of claim 1 wherein said mixture of salts is a mixture of $NaNO_3$ (70 weight %) and NaCl (30 weight %).

15. The high brightness point ion source of claim 1 wherein said mixture of acids is a mixture of $H_3PO_4$ (80 weight %) and $H_2SO_4$ (20 weight %).

16. A method for ion emission in the vacuum column of a FIB system comprising the steps of:
  a) preparing a mixture of ionic compounds that has a liquid state, said ionic compounds selected from the group consisting of a mixture of salts, a mixture of acids and a mixture of bases;
  b) fabricating an ion emitting means (11) comprising a needle (13) made of refractory ceramic material that is wetted by said ionic compound and having a point shaped extremity referred to as the tip (13a) having an apex (13a') covered by a coating of said mixture either in the liquid or solid state;
  c) fabricating an ion extracting means (12) essentially consisting of a metal extracting electrode (20) provided with a central aperture (20a) that is affixed on a metallic body (19) by adjustable means (21);
  e) mounting the ion emitting means in the ion extracting means to have it firmly secured and well centered therein; then, accurately adjusting the spacing between the aperture of said extracting electrode and the tip apex to achieve a high brightness point ion source;
  f) placing the ion source at the emission point of the FIB column;
  g) heating the needle if said coating is in the solid state; and,
  h) applying an appropriate extraction voltage between said coating at the tip apex and said ion extraction means to create an electrostatic field that is sufficient to produce an ion beam.

* * * * *